United States Patent [19]
Kawata et al.

[11] Patent Number: 5,889,735
[45] Date of Patent: Mar. 30, 1999

[54] THERMOELECTRICALLY POWERED WRIST WATCH

[75] Inventors: Masayuki Kawata; Akira Takakura, both of Chiba, Japan

[73] Assignee: Seiko Instruments Inc., Japan

[21] Appl. No.: 950,987

[22] Filed: Oct. 15, 1997

[30] Foreign Application Priority Data

Oct. 16, 1996 [JP] Japan ..................................... 8-273786
Aug. 4, 1997 [JP] Japan ..................................... 9-209462

[51] Int. Cl.⁶ .............................. G04B 1/00; G04C 3/00; H01L 33/30
[52] U.S. Cl. ............................ 368/64; 368/205; 136/205
[58] Field of Search ....................... 368/64, 88, 203–204, 368/276; 136/205, 211, 212, 224; 307/48, 72

[56] References Cited

U.S. PATENT DOCUMENTS 4,106,279  8/1978  Martin .
4,213,292  7/1980  Delelac .
5,517,468  5/1996  Inoue et al. .
5,705,770  1/1998  Ogasasara et al. .

FOREIGN PATENT DOCUMENTS 2310589  5/1976  France .
2425664  5/1979  France .

OTHER PUBLICATIONS

Patent Abstracts of Japan, vol. 096, No. 006 Jun. 28, 1996.

*Primary Examiner*—Vit W. Miska
*Attorney, Agent, or Firm*—Adams & Wilks

[57] ABSTRACT

A thermoelectriocally powered wristwatch has an endothermic plate affixed to the underside of a case back for absorbing external heat, and a thermal conduction plate for conducting the absorbed heat through heat transfer pins to a thermoelectric conversion element which converts the absorbed heat to electricity for powering the wristwatch. Thermal conduction preventive packings formed of a material having low thermal conductivity, such as plastic or rubber, are interposed between the endothermic plate and the case back and between the case back and the thermal conduction plate.

9 Claims, 10 Drawing Sheets

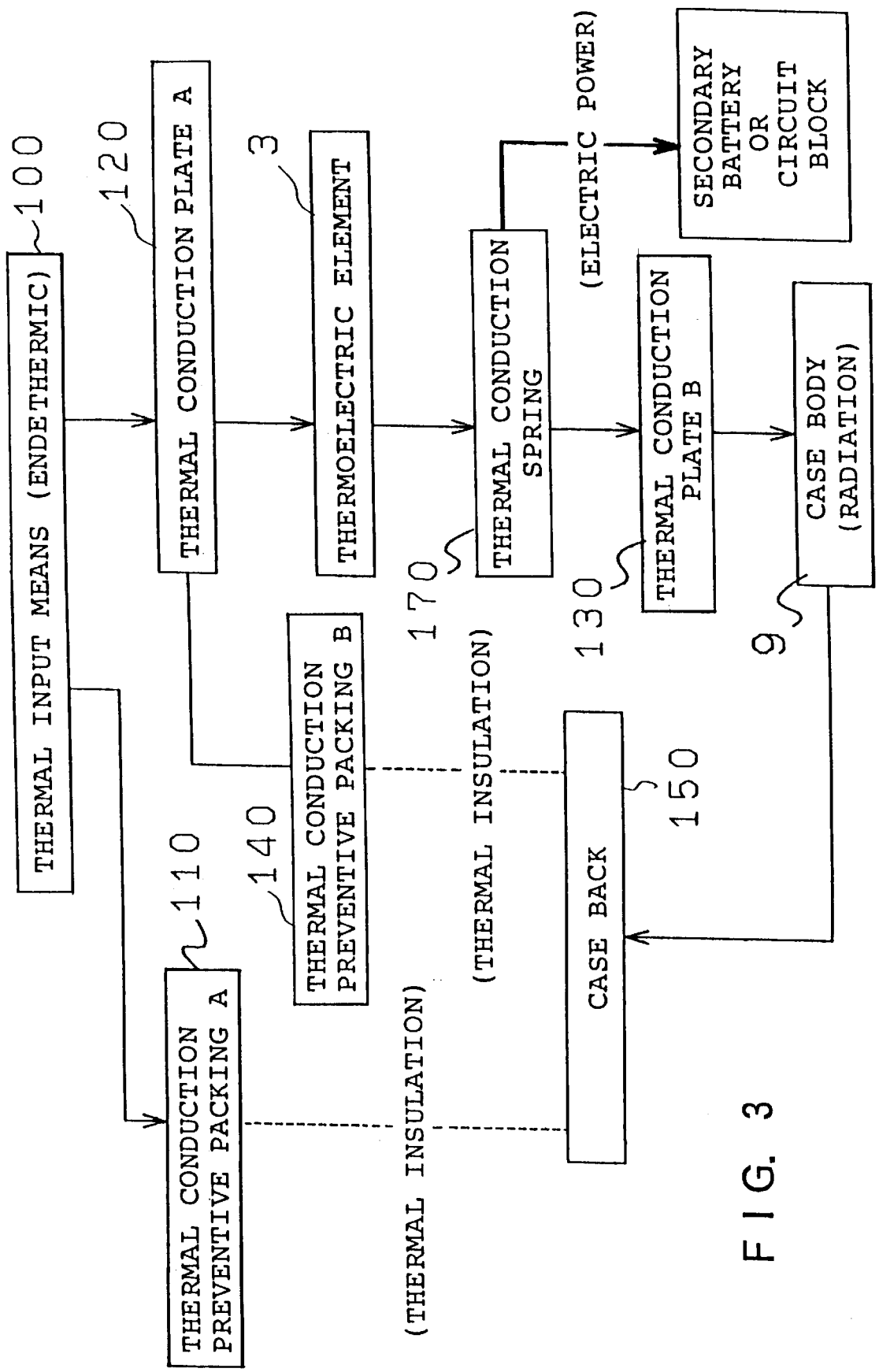
F I G. 3

THERMOELECTRICALLY POWERED WRIST WATCH

BACKGROUND OF THE INVENTION

The present invention relates to a thermoelectrically powered wrist watch in which the energy generated in a thermoelectric element, making a thermoelectric conversion by using the difference between the human body temperature and the outside air temperature at the time when a person has put the wrist watch on his arm, is used as a power source for actuating the hands thereof.

Conventionally, there is known a thermoelectrically powered wrist watch such as that disclosed in Japanese Patent Application Laid-Open Publication No. 55-20483. That is, as illustrated in FIG. 2, a heat insulation member 30 is disposed at the side surface of a case, and the heat absorbed from the outside through a case back 150 is transferred to one end of a thermoelectric element 3 which is a thermoelectric generator, through a metallic plate 31 which is an elastic member.

On the other hand, the heat absorbed into the case is radiated from the other end of the thermoelectric element 3 to the outside through a shock absorbing member 32 consisting of a metallic elastic member, an intermediate ring 33 constituted by a metallic ring, a dial 6, an exteriorly equipped recess padding edge 34, etc.

The above-constructed thermoelectrically powered wrist watch can supply thereto a larger amount of heat energy by absorbing heat from a wearer's arm through a bottom portion of the case having a large area.

In the conventional thermoelectrically powered wrist watch, since a larger amount of heat energy is absorbed into the case, it is necessary to prevent the occurrence of the phenomenon that the temperature inside the case rises with the result that the temperatures at both ends of the thermoelectric element 3 are brought into equilibrium with each other, i.e., the temperature difference between the both ends thereof becomes zero, resulting in that the thermoelectric element 3 is brought to a state capable of generating no power.

On this account, in order to radiate the heat from a glass 7 or recess padding edge 34 to the outside of the case with a high efficiency, a heat insulation member 30 made of plastic material or the like had to be provided at the side surface of the case so as to insulate the heat absorbed from the bottom surface of the case.

Therefore, it is necessary that the case itself be constructed of two parts, i.e., heat insulation member 30 and recess padding edge 34. That is, the case itself becomes unable to be finished to a solid or one-piece metallic case. In consequence, the outer appearance of the case looks inferior and further the manufacturing cost thereof also increases.

Further, with the radiating means which uses the glass 7 having a low thermal conductivity, the recess padding edge 34 having a small surface area and the like, it is impossible to perform sufficient radiation of the heat inside the case, with the result that the temperature equilibrium is inconveniently established inside the case and as a result the thermoelectric conversion efficiency becomes inconveniently low. In addition, covering the entire circumferential side surface of the case by the heat insulation member 30 having a high heat insulating effect, also, causes a decrease in the thermoelectric conversion efficiency.

SUMMARY OF THE INVENTION

In the present invention, it becomes possible to supply a larger amount of heat energy to the thermoelectrically powered wrist watch by using a bottom portion of the case having an area equal to that of the conventional bottom portion of the case and also to finish the case to a one-piece type metallic case. Therefore, the case comes to look superior and in addition the manufacturing cost thereof can be reduced by integration thereof. Also, by enlarging the surface area of the metallic case, the heat inside the case can be radiated to the outside with a high efficiency.

BRIEF DESCRIPTION OF THE DRAWINGS

FIG. 3 is a flow chart illustrating a thermal conduction path of the thermoelectrically powered wrist watch according to the first embodiment of the present invention.

DETAILED DESCRIPTION OF THE PREFERRED EMBODIMENTS

Figure 1:
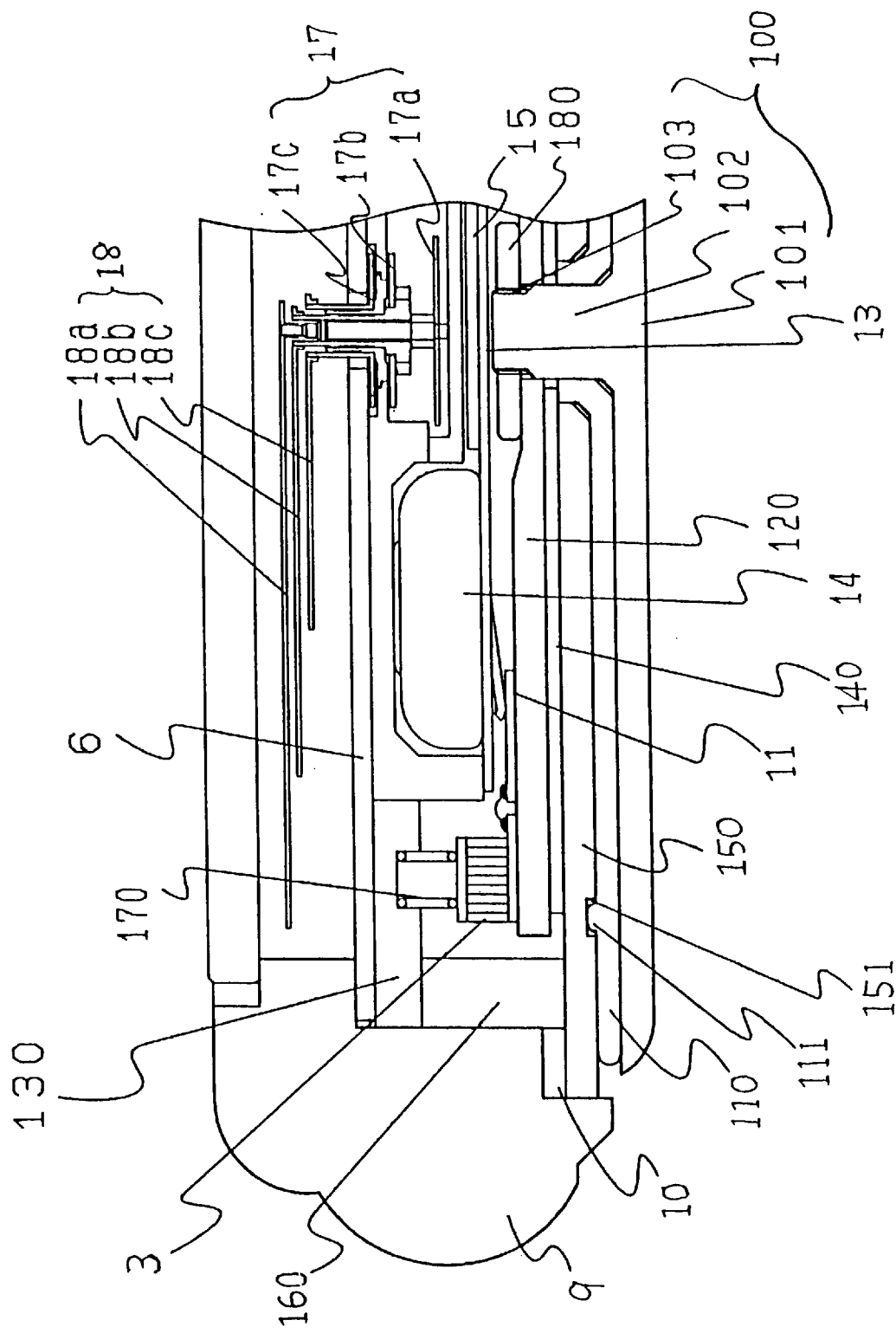
FIG. 1 is a vertical sectional view illustrating the structure of a thermoelectrically powered wrist watch according a first embodiment of the present invention.
Figure 2:
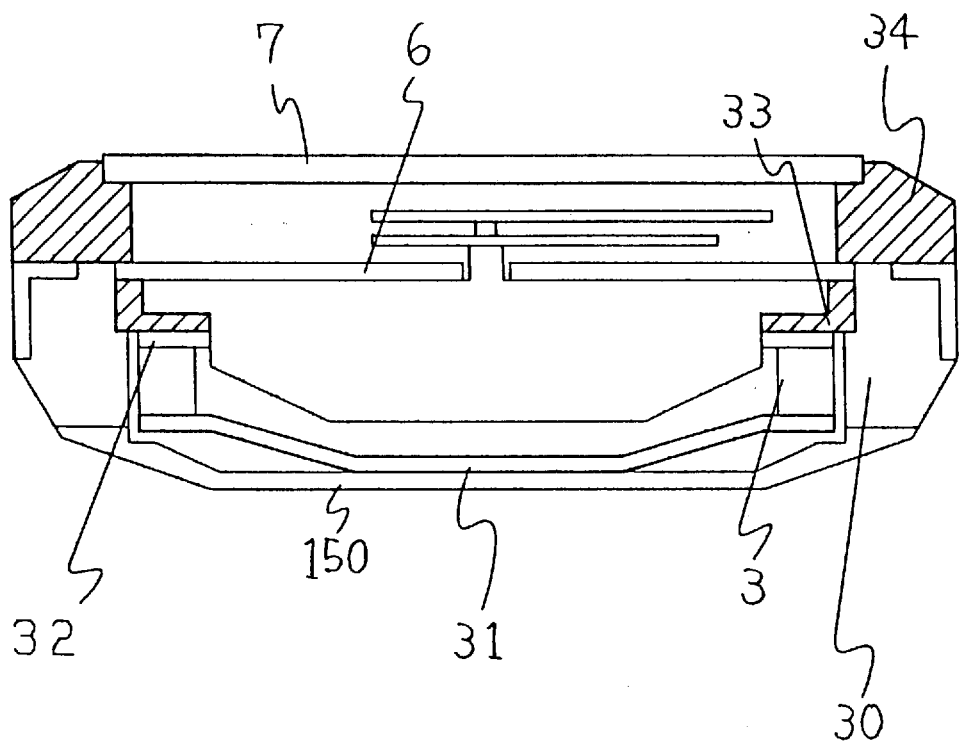
FIG. 2 is a vertical sectional view illustrating the structure of a conventional thermoelectrically powered wrist watch.

In the thermoelectrically powered wrist watch of the present invention, thermal input means wherein an endothermic plate and a heat transfer pin are integrated with each other is provided under a case back. Further, between the case back and the endothermic plate and between the case back and the thermal conduction means A, there are respectively provided thermal conduction preventive packings each formed of a material having a low thermal conductivity such as plastic or rubber material. And, the heat transfer pin is passed through through-holes formed in the case back and thermal conduction preventive packings and is engaged with a through-hole of the thermal conduction means located inside the case and formed of a metallic plate having a high thermal conductivity. Then, the thermal conduction means A and the heat transfer pin are fixed by thermal caulking or screwing to bring the thermal input means, case back, thermal conduction preventive packings and thermal conduction, means A into pressure contact with one another.

With this arrangement, the body temperature (heat of the arm) absorbed by the endothermic plate can be conducted through the heat transfer pin to the thermal conduction means without being conducted to the case and can be further conducted highly efficiently to one end (input portion) of a thermoelectric element always in contact with the thermal conduction means A.

Also, the other end (output portion) of the thermoelectric element is always in contact with thermal conduction means B which is a plate part separate from that constituting the thermal conduction means as previously referred to. The thermal conduction means B is also kept always in contact with a body of the case. By this arrangement being made beforehand, it is possible to cause the body of the case, whose temperature is in equilibrium with the outside air temperature, and the output portion of the thermoelectric element to be maintained always at the same temperature.

By maintaining a state where a temperature difference always exists between both ends of the thermoelectric element (i.e., between the body temperature and the outside air temperature) as mentioned above, it becomes possible to thermoelectrically convert the thermal energy to an electric energy with a high efficiency.

Also, by providing a thermal conduction spring formed of a metallic elastic material between at least one thermal conduction means B of the above-mentioned two thermal conduction means A and B and the body of the case, between the thermal conduction means B and the thermoelectric element or between this thermoelectric element and the thermal conduction means A, it is possible to absorb by the thermal conduction spring the shock applied from the outside or the pressure applied at the time of assembly and thereby prevent the destruction of the thermoelectric element.

Also, by providing at a plurality of positions the heat transfer pin of the thermal input means and the respective through-holes of the case back and thermal conduction preventive packings, the pressure contact force between the thermal conduction means A and the heat transfer pin is increased, the waterproof property is enhanced and the thermoelectric conversion efficiency is upped.

Further, although in the above description the thermal input means has been mounted on the case back, in the present invention even a case whose body and bottom portion are moulded integrally with each other can also be realized. In this case, it is sufficient that a through-hole be provided in the bottom portion of the case.

Further, by providing thermal ray condensing means in the glass or dial and also providing in, for example, a main plate a light guiding hole or light transmission member for radiating light condensed by the thermal ray condensing means onto the thermal conduction means A, it is possible to elevate the temperature of the thermal conduction means A and thereby up the thermoelectric conversion efficiency.

Embodiments of the present invention will now be explained hereafter with reference to the drawings.

[First Embodiment]

First, an explanation will be given of a structure of a first embodiment of a thermoelectrically powered wrist watch according to the present invention with reference to FIG. 1. In the first embodiment, in order to absorb (input) heat highly efficiently to a thermoelectric element 3 there are used thermal input means 100, thermal conduction preventive packing 110, thermal conduction means in the form of a thermal conduction plate A 120 and thermal conduction preventive packing 140.

The thermal input means 100 is composed of an endothermic plate 101 consisting of a metallic member, a heat transfer pin 102 and a threaded portion 103.

The thermal conduction preventive packing A 110 is formed of a material having a low thermal conductivity such as plastic or rubber material and has formed thereon and therein a waterproofing protruding portion 111 and a through-hole for inserting the heat transfer pin 102 respectively.

The thermal conduction plate A 120 is a plate which consists of a metallic member and has formed therein the through-hole for inserting the heat transfer pin 102 and has bonded thereon one end of the thermoelectric element 3 and a printed circuit board 11.

The thermal conduction preventive packing B 140 is formed of a material having a low thermal conductivity such as plastic or rubber material and has formed therein the through-hole for inserting the heat transfer pin 102.

A case back 150 has formed therein the through-hole for inserting the heat transfer pin 102 and a waterproof recess 151. And the case back 150 clamps a case back packing 10 between itself and a body 9 of the case and is engaged with a part of the case body 9.

And, the parts of the thermal input means 100, thermal conduction preventive packing A 110, case back 150, thermal conduction preventive packing B 140 and thermal conduction plate A 120 are superposed one upon another in vertical section and in the order mentioned. Then, the heat transfer pin 102 is inserted into the through-holes formed in the respective parts. Then, using a female fixing screw 180 mounted onto the threaded portion 103, the thermal input means 100, thermal conduction preventive packing A 110, case back 150, thermal conduction preventive packing B 140 and thermal conduction plate 120 are pressure bonded together.

On the other hand, in order to highly efficiently radiate (output) the heat of the thermoelectric element 3 to the outside, the case body 9, thermal conduction plate B 130 and thermal conduction spring 170 are used.

The body 9 of the case is made of metallic material. The thermal conduction plate B 130 is a metallic circular disk plate and has in a part of its underside a recess for inserting the thermal conduction spring 170. The thermal conduction spring 170 is a metallic elastic member.

And, one end of the thermal conduction spring 170 is contacted with the other end of the thermoelectric element 3 and the other end thereof is contacted with the thermal conduction plate B 130. The outer-peripheral surface of the thermal conduction plate B 130 is contacted with the inner-peripheral surface of the case body, thereby positioning the dial 6, thermal conduction plate B 130 and casing frame 160 in the vertical-sectional direction.

It is to be noted that in order to enhance the waterproofing property of the thermoelectrically powered wrist watch according to the first embodiment of the present invention, the protruding portion 111 formed on the thermal conduction preventive packing A 110 is buried into the waterproofing recess 151 provided in the bottom portion of the case back 150. And, by pressurizing the thermal conduction preventive packing A 110 vertical-sectionally by the endothermic plate 101 and the fixing female screw 180, the adhesion between the protruding portion 111 and the waterproofing recess 151 is enhanced to thereby perform a waterproofing action.

Next, a thermal conduction path of the thermoelectrically powered wrist watch according to the present invention will be explained with reference to FIG. 3.

When a person puts the thermoelectrically powered wrist watch on his arm, the body temperature (e.g., 36° is input to the thermal input means 100. And, by way of the thermal input means 100 and the thermal conduction plate A 120 which is the thermal conduction means kept in contact with the thermoelectric element 3, the absorbed heat is conducted to one end of the thermoelectric element 3. As a result, the temperature at one end of the thermoelectric element 3 becomes equal to the body temperature.

On the other hand, the other end of the thermoelectric element 3, thermal conduction spring 170, thermal conduction plate B 130 constituting the thermal conduction means, and the body 9 of the case are in mechanical contact with one another and the temperature of these members is in equilibrium with the outside air temperature (e.g., 24° C.) As a result, the other end of the thermoelectric element 3 becomes the same as the outside air temperature.

Accordingly, the temperature difference between the both ends of the thermoelectric element 3 becomes 10° C. or so and this temperature difference is thermoelectrically converted to an electric energy by the thermoelectric element 3.

It is to be noted that in order to prevent the heat of the thermal input means 100 from being conducted to the case body 9, the thermal conduction preventive packing A 110 is provided between the thermal input means 100 and the case back 150 and further, the thermal conduction preventive packing B 140 is provided between the case back 150 and the thermal conduction plate A 120.

In the above-mentioned way, by utilizing the difference between the body temperature outside the watch and the outside air temperature, the temperature corresponding to this difference is converted to an electric energy by the thermoelectric element 3. And, this electric energy is stored in a secondary battery 14 through a printed circuit board provided with electric passages and a holder plate consisting of a metallic member. And, using this electric energy as a power source, an electric circuit 15, motor, etc. of the watch are driven to thereby drive hand train wheels 17 including a fourth wheel pinion 17a, second wheel pinion 17b, hand wheel 17c, etc. of a watch movement to thereby further drive hands 18 such as a second hand 18a, minute hand 18b and hour hand 18c which are engaged with the hand train wheels 17. In this embodiment, the heat transfer pin 102 is located at the center of the movement. An electronic timepiece which indicates time through such mechanism is one embodiment of the thermoelectrically powered wrist watch according to the present invention.

It is to be noted that although in this embodiment time has been indicated by means of the hands, time may be displayed electrically by means of a display panel using a liquid crystal display or the like. The electronic timepiece which permits the use of such time display also is one embodiment of the thermoelectrically powered wrist watch according to the present invention.

[Second Embodiment]

Figure 4:
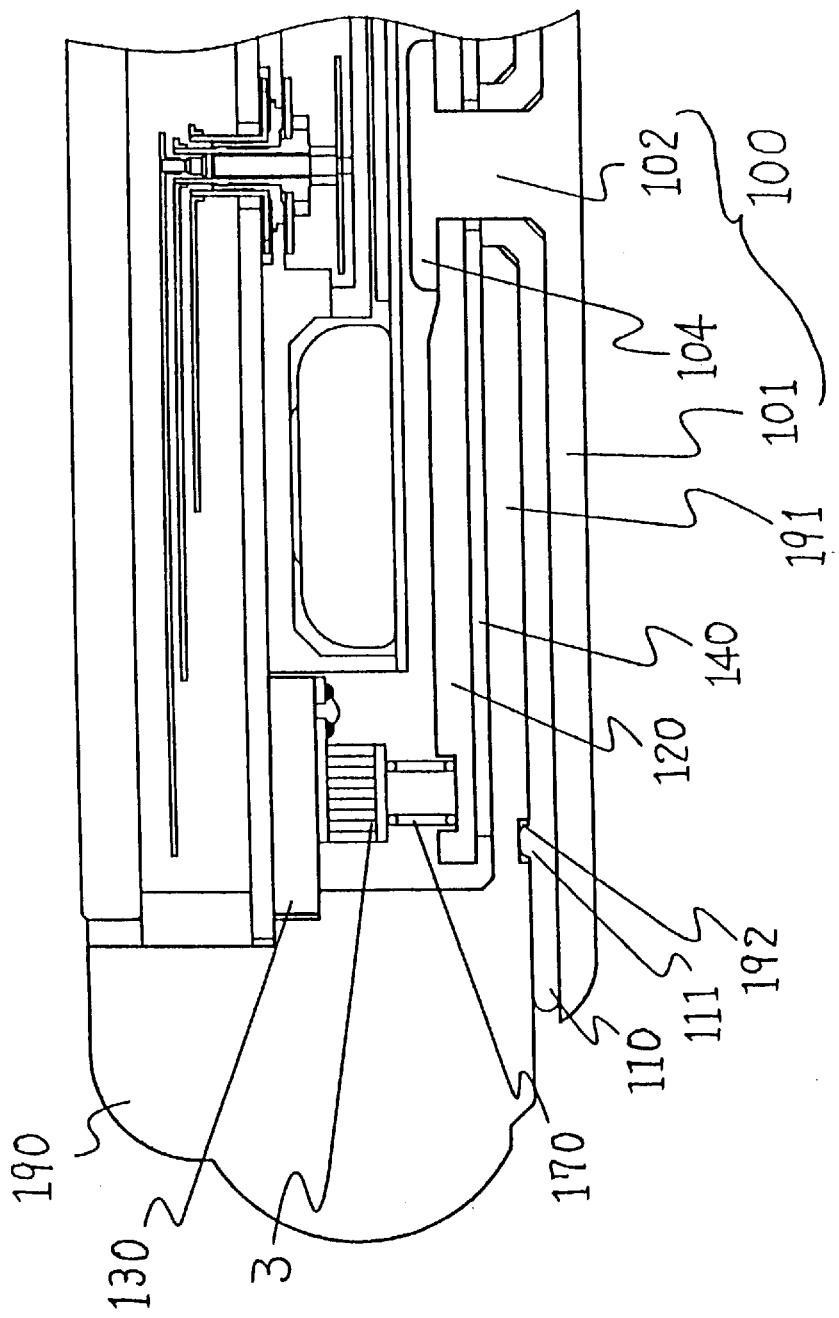
FIG. 4 is a vertical sectional view illustrating the structure of a thermoelectrically powered wrist watch according to a second embodiment of the present invention.

FIG. 4 is a second embodiment of the thermoelectrically powered wrist watch according to the present invention which features the use of a one-piece case 190 wherein the case body and the case back are integrated with each other.

While the one-piece case 190 according to the second embodiment of the present invention is of a structure similar to that of a one-piece case for use in an ordinary wrist watch, a waterproofing recess 192 has been provided in a bottom portion 191 of the case.

The second embodiment of the present invention is structured such that the thermal input means 100, thermal conduction preventive packing A 110, case bottom portion 191, thermal conduction preventive packing B 140 and thermal conduction plate A 120 are vertical-sectionally superposed one upon another in the order mentioned. And, by a caulking portion prepared by deforming a head portion of the heat transfer pin 102, the thermal input means 100 is fixed vertical-sectionally to thereby pressure bond the thermal input means 100, thermal conduction preventive packing A 110, case bottom portion 191, thermal conduction preventive packing B 140 and thermal conduction plate A 120 together.

As in the case of the first embodiment, the heat absorbed into the endothermic plate 101 is conducted to the thermal conduction plate A 120 by way of the heat transfer pin 102 and is conducted to one end of the thermoelectric element 3 through the thermal conduction spring 170.

On the other hand, the other end of the thermoelectric element 3 is bonded to the thermal conduction plate B 130, the outer-peripheral portion of which is further contacted with the case body 9.

Accordingly, a temperature difference is produced between the both ends of the thermoelectric element 3, with the result that it is possible to obtain an electric energy through the thermoelectric conversion of the thermoelectric element 3.

It is to be noted that in order to enhance the waterproofing property of the thermoelectrically powered wrist watch according to the second embodiment of the present invention, the waterproofing recess 192 is formed in the bottom portion 191 of the case and the waterproofing protruding portion 111 formed on the thermal conduction preventive packing A 110 is buried into the waterproofing recess 192. And, by pressurizing the thermal conduction preventive packing A 110 vertical-sectionally by the endothermic plate 101 and the caulking portion 104, the adhesion between the protruding portion 111 and the waterproofing recess 192 is enhanced to thereby perform a waterproofing action.

[Third Embodiment]

Figure 5:
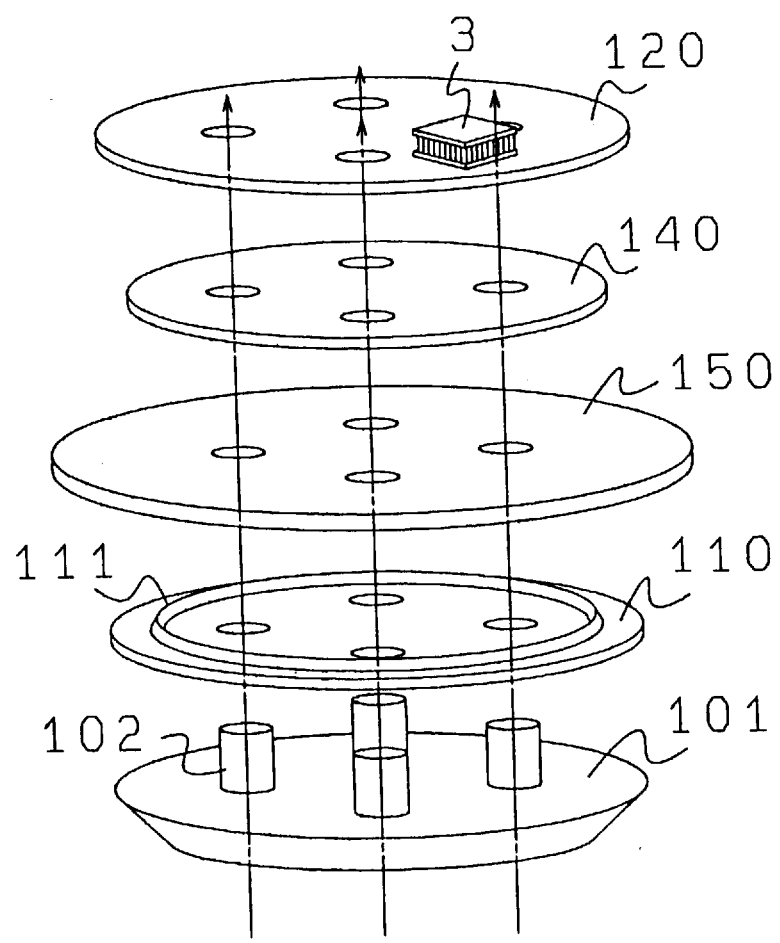
FIG. 5 is a view illustrating the structure of a third embodiment of the present invention.

FIG. 5 illustrates a third embodiment of the thermoelectrically powered wrist watch according to the present invention. In this embodiment, a plurality of heat transfer pins 102 are provided on the endothermic plate 101 and through-holes are formed in the thermal conduction preventive packing A 110, case back 150, thermal conduction preventive packing B 140 and thermal conduction plate A 120 in a number equal to that of the heat transfer pins 102.

[Fourth Embodiment]

Figure 6:
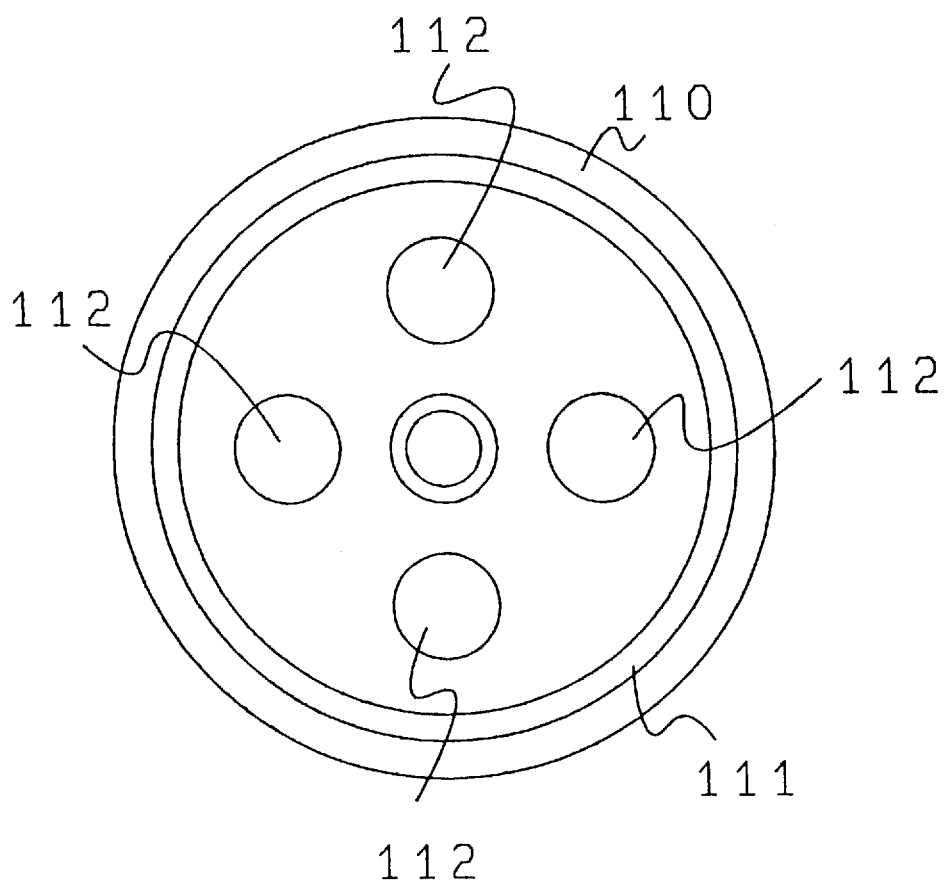
FIG. 6 is a view illustrating a thermal conduction preventive packing according to a fourth embodiment of the present invention.

FIG. 6 illustrates a fourth embodiment of the thermoelectrically powered wrist watch according to the present invention. This embodiment has a feature in that the thermal conductivity of the thermal conduction preventive packing A 110 or the thermal conduction preventive packing B 140 is suppressed to be at a small value. Specifically, a plurality of through-holes 112 other than those for permitting the passage therethrough of the heat transfer pins 102 have been provided in the thermal conduction preventive packing A 110 or thermal conduction preventive packing B 140 to thereby increase in number of the air zones having a thermal conductivity lower than that of plastic or rubber material.

[Fifth Embodiment]

Figure 7:
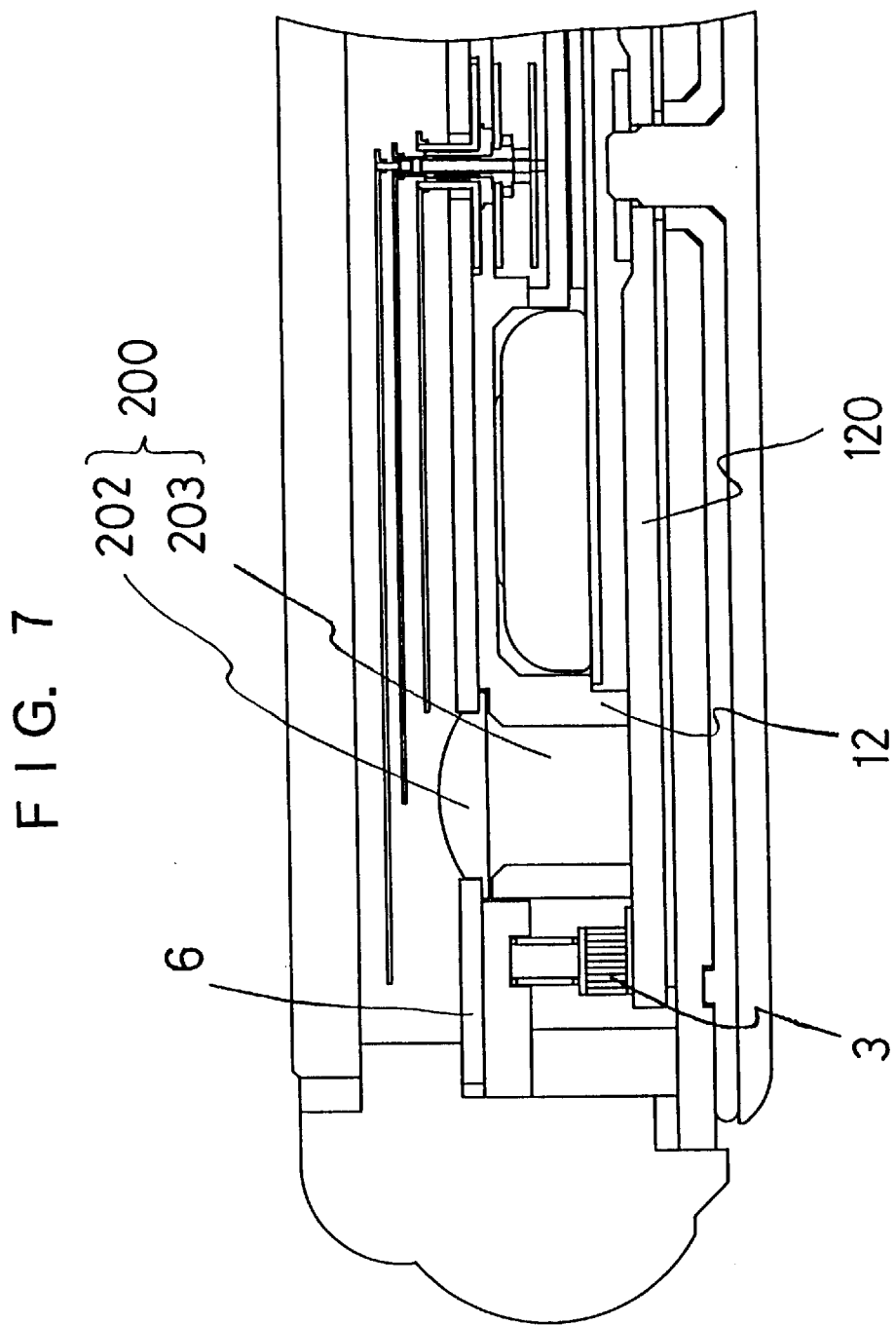
FIG. 7 is a view illustrating the structure of a fifth embodiment of the present invention.

FIG. 7 illustrates a fifth embodiment of the thermoelectrically powered wrist watch according to the present invention. A through-hole is provided in at least a part of each of, for example, the dial 6 and the main plate 12 to thereby provide thermal ray condensing means 200 composed of a condensing member 202 for condensing light such as sunlight and a light guiding hole 203. Thereby, this thermal ray condensing means has been disposed so as to radiate the thermal rays obtained by condensing light such as sunlight onto the thermal conduction plate A 120 contacted with the thermoelectric element 3.

[Sixth Embodiment]

Figure 8:
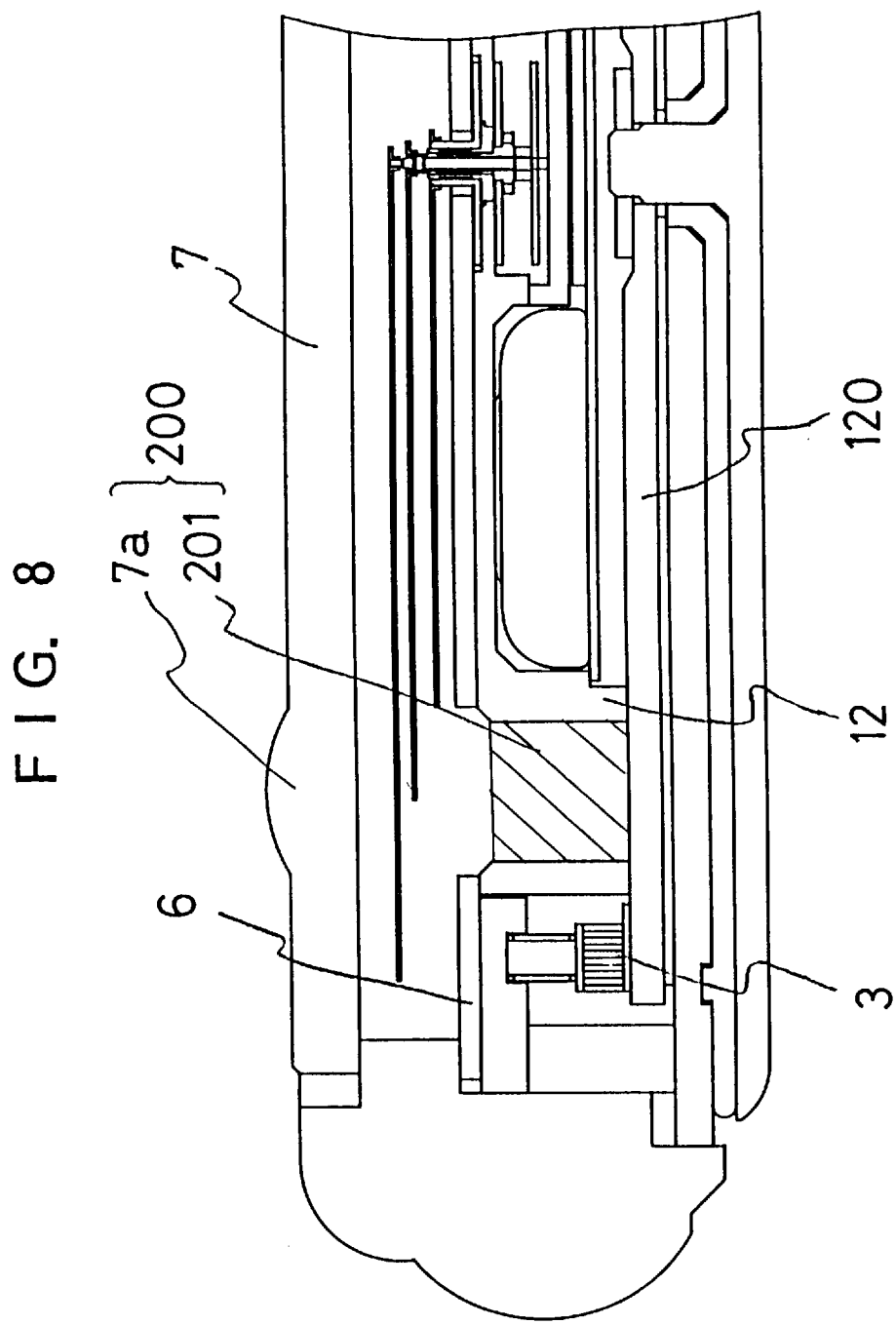
FIG. 8 is a view illustrating the structure of a sixth embodiment of the present invention.

FIG. 8 illustrates a seventh embodiment of the thermoelectrically powered wrist watch according to the present invention. A condensing portion 7a constituting the thermal ray condensing means 200 is provided on the glass 7 and further there is provided a light transmission member 201 which is guided and fixed by the through-hole formed in, for example, the main plate 12. Thereby, this thermal ray condensing means has been disposed so as to radiate the thermal rays obtained by condensing light such as sunlight onto the thermal conduction plate A 120 contacted with the thermoelectric element 3.

[Seventh Embodiment]

Figure 9:
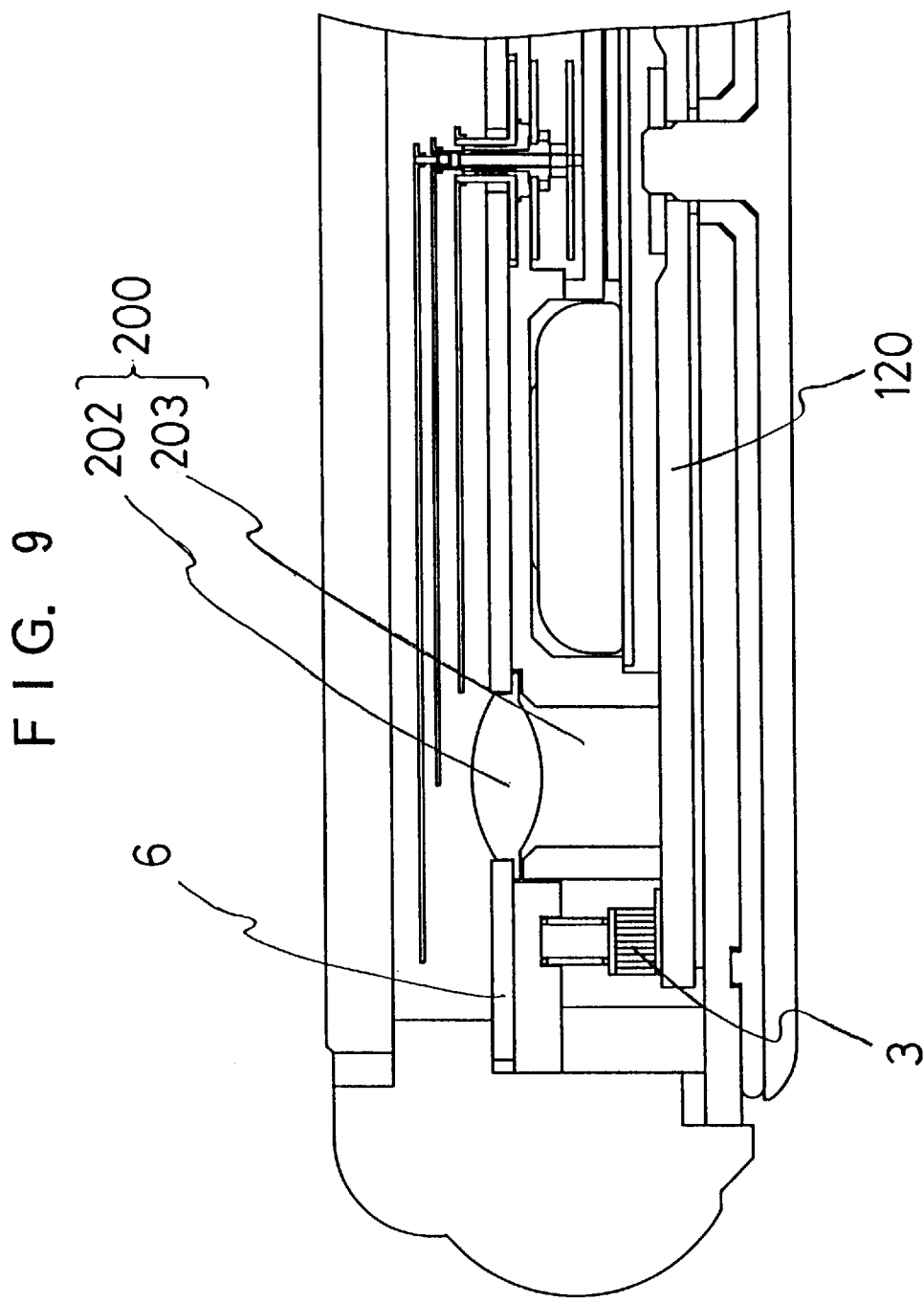
FIG. 9 is a view illustrating the structure of a seventh embodiment of the present invention.

FIG. 9 illustrates a seventh embodiment of the thermoelectrically powered wrist watch according to the present invention. The condensing member 202 constituting the thermal ray condensing means 200 is made up into a configuration wherein the obverse and reverse surfaces thereof are respectively made convex so that a larger amount of light such as sunlight can be condensed. Thereby, this thermal ray condensing means has been disposed so as to enable the resulting thermal rays having passed through the light guiding hole 203 to be radiated onto the thermal conduction plate A 120 contacted with the thermoelectric element 3.

[Eighth Embodiment]

Figure 10:
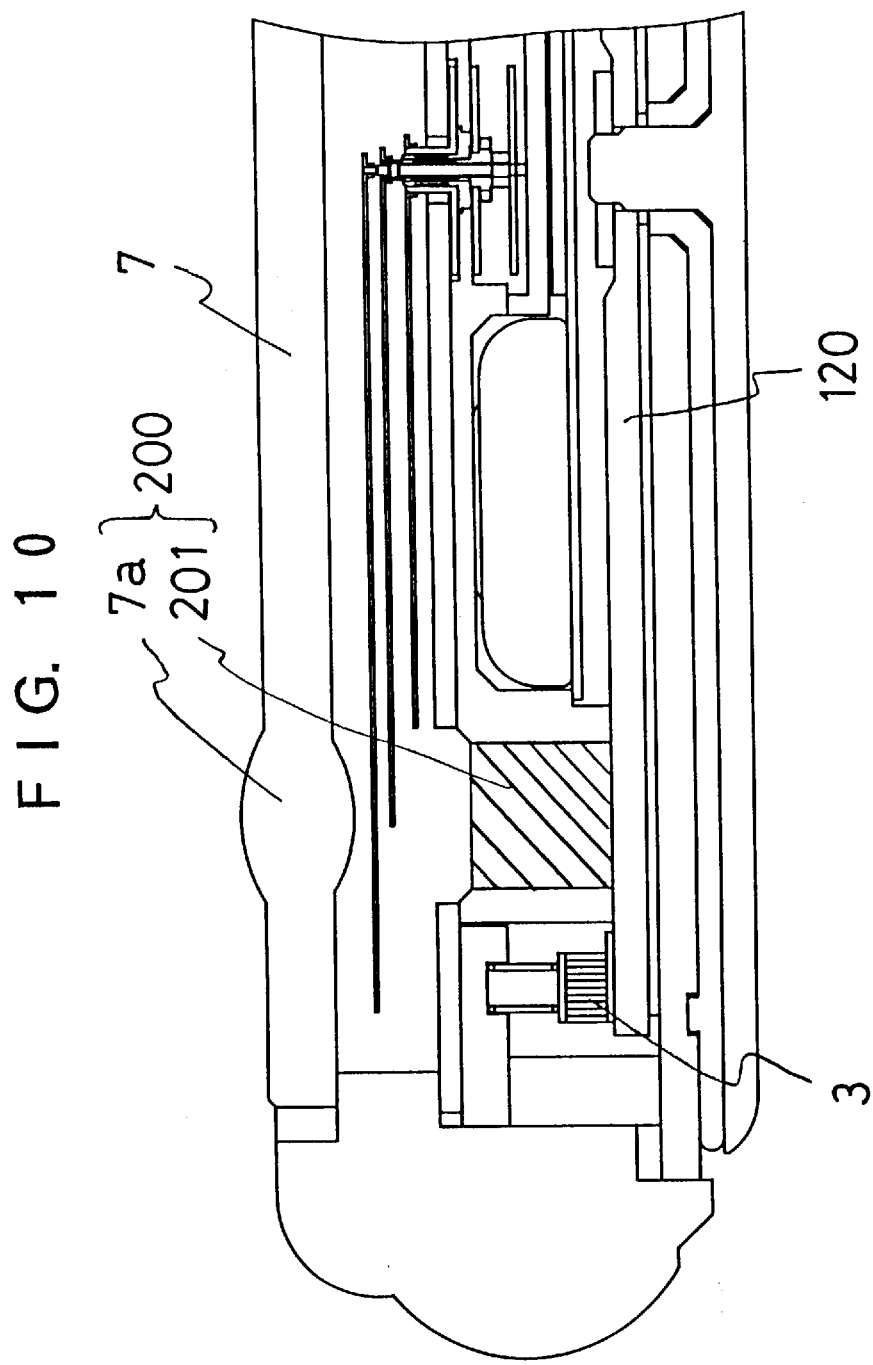
FIG. 10 is a view illustrating the structure of an eighth embodiment of the present invention.

FIG. 10 illustrates an eighth embodiment of the thermoelectrically powered wrist watch according to the present invention. The condensing portion 7a provided on the glass 7 and constituting the thermal ray condensing means 200 is made up into a configuration wherein the obverse and reverse surfaces thereof are respectively made convex so that a larger amount of light such as sunlight can be condensed. Thereby, this thermal ray condensing means has been disposed so as to cause the resulting thermal rays having passed through the light transmission member 201 to be radiated onto the thermal conduction plate A 120 contacted with the thermoelectric element 3.

The present invention is worked out in the above-described modes and brings about the effects which will be described as follows.

First, as a result of the fact that the case body can be formed of a solid metallic part, it is possible to enlarge the surface area of the metallic case body constituting the radiating means for radiating heat inside the case, with the result that the heat inside the case can be radiated to the outside with a high efficiency. Therefore, the thermoelectric conversion efficiency of the thermoelectric element becomes high. Also, the outer appearance of the case comes to look better and in addition it becomes also possible to reduce the manufacturing cost due to the integral formation of the case.

Further, by providing the endothermic plate under the bottom of the case, the area through which the heat is absorbed becomes enlarged, with the result that a larger amount of heat energy becomes able to be supplied to the thermoelectrically powered wrist watch.

Next, by plurally providing the heat transfer pin on the endothermic plate, the amount of the heat transferred from the endothermic plate to the thermoelectric element can be increased and in addition the pressure contact force from the endothermic plate to the thermal conduction plate A becomes high and in addition the waterproof property also becomes high.

And, by providing in the thermal conduction preventive packing the through-holes permitting the passage therethrough of the heat transfer pins (by increasing the air zone having a low thermal conductivity), the thermal conductivity from the endothermic plate to the case back or case bottom can be suppressed to a small value, whereby it is possible to prevent the equilibrium of the temperature inside the case from being established.

What is claimed is:

1. A thermoelectrically powered wrist watch comprising: a case back, a case body whose temperature comes into equilibrium with an outside air temperature and which is made of a metallic material, a thermoelectric element for thermally converting a temperature difference to an electric energy, thermal input means composed of an endothermic plate disposed under a bottom portion of the case back and a heat transfer pin, and thermal conduction means comprised of at least one metallic member in contact with one end of the thermoelectric element;

wherein at least two thermal conduction preventive packings each made of a plastic or rubber material are disposed between the endothermic plate and the case back and between the case back and the thermal conduction means, respectively, as viewed in vertical section; and wherein the heat transfer pin is inserted into through-holes formed in the thermal conduction preventive packings, thermal conduction means and case back and, by mechanical fixing means such as caulking or screwing, the heat transfer pin and the thermal conduction means are fixed to thereby bring the thermal input means, thermal conduction means, thermal conduction preventive packings and case back into pressure contact with one another.

2. A thermoelectrically powered wrist watch as set forth in claim 1, including at least one thermal conduction spring consisting of a metallic elastic member provided on the thermal conduction means.

3. A thermoelectrically powered wrist watch as set forth in claim 1, including a plurality of through-holes, other than those used to insert the heat transfer pin, formed in one of the thermal conduction preventive packings.

4. A thermoelectrically powered wrist watch as set forth in claim 1, wherein by using in place of the case back a case bottom portion moulded integrally with the case body, the thermal input means, thermal conduction means, thermal conduction preventive packings and case bottom portion are brought into pressure contact with each other.

5. A thermoelectrically powered wrist watch as set forth in claim 1, wherein the heat transfer pin is located at the center of a movement.

6. A thermoelectrically powered wrist watch as set forth in claim 1, wherein positioning of the thermal conduction spring is performed in a flat plane using a recess portion of the thermal conduction means.

7. A thermoelectrically powered wrist watch as set forth in claim 1, including thermal ray condensing means composed of a condensing member for condensing light such as sunlight or a condensing portion, and a light guiding hole or a light transmission member for causing the condensed light to be radiated onto the thermal conduction means.

8. A thermoelectrically powered wrist watch as set forth in claim 7, wherein the condensing member is formed of thermoplastic resin such as glass, acrylic or polycarbonate.

9. A thermoelectrically powered wrist watch as set forth in claim 7, wherein the light transmission member is formed of thermoplastic resin such as glass, acrylic or polycarbonate.

* * * * *